(12) United States Patent
Kau et al.

(10) Patent No.: US 7,547,597 B2
(45) Date of Patent: Jun. 16, 2009

(54) DIRECT ALIGNMENT SCHEME BETWEEN MULTIPLE LITHOGRAPHY LAYERS

(75) Inventors: Derchang Kau, Cupertino, CA (US); Khaled Hasnat, San Jose, CA (US); Everett Lee, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 11/501,129

(22) Filed: Aug. 7, 2006

(65) Prior Publication Data

US 2006/0267224 A1    Nov. 30, 2006

Related U.S. Application Data

(62) Division of application No. 10/435,495, filed on May 8, 2003, now Pat. No. 7,087,943.

(51) Int. Cl.
*H01L 21/8238* (2006.01)
*H01L 21/4763* (2006.01)

(52) U.S. Cl. ............... 438/233; 438/586; 438/597; 257/E21.627; 257/E21.641; 257/E21.658

(58) Field of Classification Search ............ 438/233, 438/533, 586, 597; 257/E21.434, E21.507, 257/E21.627, E21.641
See application file for complete search history.

(56) References Cited

U.S. PATENT DOCUMENTS

| | | |
|---|---|---|
| 4,830,977 A | 5/1989 | Katto et al. |
| 4,896,302 A | 1/1990 | Sato et al. |
| 5,287,307 A | 2/1994 | Fukuda et al. |
| 5,333,122 A | 7/1994 | Ninomiya |
| 5,340,762 A | 8/1994 | Vora |
| 5,615,150 A | 3/1997 | Lin et al. |
| 5,668,389 A | 9/1997 | Jassowski et al. |
| 5,742,099 A | 4/1998 | Debnath et al. |
| 5,973,356 A | 10/1999 | Noble et al. |
| 6,006,024 A | 12/1999 | Guruswamy et al. |
| 6,034,886 A | 3/2000 | Chan et al. |
| 6,096,602 A * | 8/2000 | Kim et al. ........... 438/257 |
| 6,143,600 A | 11/2000 | Takaishi |
| 6,236,618 B1 | 5/2001 | Roy |
| 6,791,128 B1 | 9/2004 | Yamauchi |
| 6,888,730 B2 | 5/2005 | Foss et al. |
| 2002/0079515 A1 | 6/2002 | Kuwazawa |

FOREIGN PATENT DOCUMENTS

JP    04-256356    9/1992

OTHER PUBLICATIONS

VLSI Technology, edited by S.M. Sze, Copyright 1983—Bell Laboratories, Incorporated, Murray Hill, New Jersey; McGraw-Hill Book Company, ISBN 0-07-062686-3, McGraw-Hill series in electrical engineering, Electronics and electronic circuits; Lithography pp. 273-274.

* cited by examiner

*Primary Examiner*—Lex Malsawma
(74) *Attorney, Agent, or Firm*—Fish & Richardson P.C.

(57) ABSTRACT

A method for directly aligning multiple lithography masking layers. The method may be used to fabricate a flash plus logic structure. The flash plus logic structure may comprise a flash memory cell, a logic cell and a transistor.

19 Claims, 2 Drawing Sheets

DIRECT ALIGNMENT SCHEME BETWEEN MULTIPLE LITHOGRAPHY LAYERS

CROSS-REFERENCE TO RELATED APPLICATIONS

This application is a divisional application of and claims priority to U.S. application Ser. No. 10/435,495, filed on May 8, 2003, now U.S. Pat. No. 7,087,943, the contents of which are incorporated herein by reference.

BACKGROUND

"Flash plus logic" integration refers to flash memory and logic, such as a static random access memory (SRAM) cells and/or transistors, formed on a shared substrate. Flash memory may typically have wordlines and bitlines to access flash memory cells. SRAM may also have wordlines and bitlines. A transistor may have a source, a gate and a drain.

A flash plus logic fabrication process may use a "pattern registration" model, which is described on pages 273-274 in "Lithography" in VLSI Technology by D. A. McGillis published in 1983. The pattern registration model is commonly used in many semiconductor planar processes. In a mask alignment scheme of a typical semiconductor planar process, "registration" refers to a process and/or accuracy of an upper masking layer aligning to an underlining mask layer. The underlining mask layer is called a "registered" layer and is formed before the upper "registering" mask layer.

DETAILED DESCRIPTION

The "pattern registration" model may be based on a registration tolerance requirement of component location variations in a nesting mask alignment scheme between two or more mask layers. The magnitude of a nesting tolerance may depend on several factors, such as:

- edge uncertainty of the registered layer;
- edge uncertainty of the registering layer; and
- overlay uncertainly of the alignment system, e.g., a lithography tool.

A registering layer may be "directly" or "indirectly" aligned to a registered layer. A top registering layer is "directly" aligned to an underlining registered layer when there are no intermediate layers. "Indirect" alignment may have a nesting tolerance between layers that are registered via one or more intermediate layers. For example, a second layer is directly aligned to an underlining first layer. A third layer is directly aligned to the second layer. The third layer is "indirectly" aligned to the first layer.

The estimated nesting tolerance of a "direct" alignment scheme, $T_D$, may be modeled as:

$$T_D = n \cdot \sqrt{\left(\frac{\sigma_{F1}}{2}\right)^2 \left(\frac{\sigma_{F2}}{2}\right)^2 + \sigma_r^2}$$

where $\sigma_{F1}$ and $\sigma_{F2}$ are 1-sigma variations of feature size distribution of the registered mask layer and the registering mask layer, respectively. Feature size distribution may also be called CD (Critical Dimension) distribution, which refers to the feature size of a mask. $\sigma_r$ is 1-sigma variation of registration distribution of an alignment process. n is the number of sigma required for the tolerance distribution.

The estimated nesting tolerance of an "indirect" alignment scheme, $T_I$, may be expressed as:

$$T_I = n \cdot \sqrt{\left(\frac{\sigma_{F1}}{2}\right)^2 + \left(\frac{\sigma_{F2}}{2}\right)^2 + \sum_1^i \sigma_{ri}^2}$$

where "i" is the number of alignment steps in the "indirect" alignment scheme.

Figure 1:
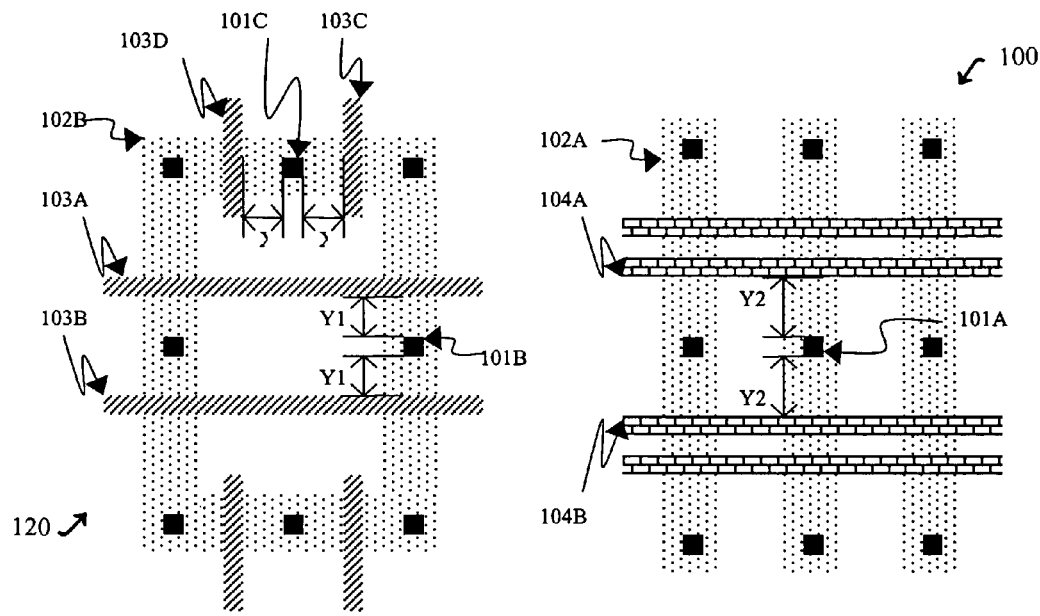
FIG. 1 illustrates a dual polysilicon patterning scheme with a flash memory cell plus logic on a shared substrate.

FIG. 1 illustrates a dual polysilicon patterning scheme with a flash memory cell 100 plus logic 120 ("flash+logic") on a shared substrate. The flash memory cell 100 may be part of a flash memory array. The flash memory plus logic configuration 100, 120 may be formed by (a) forming a diffusion layer 102 on a substrate, (b) forming a first polysilicon masking layer 104 called "SMS" (Self-aligned MoS, which may also be called "SAMOS"), (c) forming a second polysilicon masking layer 103 called "PLY," (d) optionally depositing a thin layer of Nitride serving as a contact Etch Stop Layer (called "NESL") to improve contact etch selectivity, (e) depositing a dielectric layer, e.g., silicon dioxide, over the entire wafer surface, (f) forming a contact masking layer 101 (photoresist with openings for desired contact locations 101A-101C) for contact etch process, (g) etching through dielectric (silicon dioxide) and NESL layers where contact layer 101 has openings, and (h) filling the etched contact openings with metal, such as tungsten, alumina or copper. The first polysilicon masking layer 104 may be directly aligned to the underlining diffusion layer 102. The second masking polysilicon layer 103 may be directly aligned to the first polysilicon masking layer 104. The contact masking layer 101 may be directly aligned to the second masking polysilicon layer 103. In an alternative method, the PLY polysilicon layer 103 may be formed before the SMS polysilicon layer 104.

Each layer may be patterned and etched to define the structures shown in FIG. 1. The diffusion layer 102 may be etched to form diffusion strips and segments 102A, 102B. The SMS polysilicon layer 104 may be etched to form SMS flash memory wordlines 104A, 104B. The PLY polysilicon layer 103 may be etched to form PLY Static Random Access Memory (SRAM) wordlines 103A, 103B and transistor gates 103C, 103D. The contact masking layer 101 may allow a flash bitline contact 101A, a SRAM bitline contact 101B and a transistor bitline contact 101C to be formed as explained above.

"PLY" is used to distinguish the second polysilicon layer (forming SRAM polysilicon wordlines 103A, 103B and transistor gates 103C, 103D) from the first "SMS" polysilicon layer (forming the flash wordlines 104A, 104B). Other materials besides polysilicon may be used.

The flash memory cell 100 in Fig. may include a flash bitline contact 101A, a flash diffusion layer 102A in the form of a strip, and flash wordlines 104A, 104B. Each wordline 104A, 104B is a row of flash control gates for a plurality of memory cells.

The logic 120 in FIG. 1 may include an SRAM bitline contact 101B, a transistor source/drain (S/D) contact 101C, an SRAM diffusion layer 102B in the form of a rectangle, SRAM wordlines 103A, 103B and transistor gates 103C, 103D.

Alignment may typically be done layer-by-layer, not feature-by-feature. The integrated flash plus logic pattern 100, 120 in FIG. 1 may have (a) the contact layer 101 "directly" aligned to the PLY polysilicon layer 103, and (b) the contact layer 101 "indirectly" aligned to the SMS polysilicon layer 104. For a dual polysilicon patterning scheme in a technology like flash plus logic, state-of-the-art stack gate spaces "Y2" between the flash bitline contact 101A and wordlines 104A, 104B and spaces "Y1" between the SRAM bitline contact 101B and wordlines 103A, 103B may typically be different by about 10%. This may be a problem, as described below.

The contact layer 101 may be referred to as "un-landed." "Un-landed" is generally used to contrast a conventional contact process which is "fully-landed" on a diffusion layer and a polysilicon layer. A "fully-landed" contact layer is completely enclosed by (or in contact with) landing layers, e.g., a diffusion layer and a polysilicon layer, with all sources of variation in a fabrication process. The "un-landed" contact layer 101 may be partially landed on a diffusion layer and/or a polysilicon layer in fabrication processes. "Registration" of the contact layer 101 may refer to "directly" aligning the "un-landed" contact layer 101 to the logic-based PLY polysilicon gate layer 103 or the flash-based SMS polysilicon gate layer 104 in flash-plus-logic integration.

An additional "contact-to-gate" registration requirement of the "un-landed" contact layer 101 in a flash-plus-logic process may be a problem. While maintaining a tight registration capability (specification) of the contact layer 101 with "direct" alignment to one gate layer (PLY layer 103 with SRAM wordlines and transistor gates 103A-103D to specify contact-to-gate spaces Y1 and X), the contact-to-gate space Y2 for "indirect" alignment to the SMS flash wordlines 104A, 104B of the SMS layer 104 may be larger. For example, Y2 may be larger than X or Y1 by about 10 to 40%. This may result in a different design rule for flash-plus-logic technology compared to flash-only or logic-only technologies, which may be undesirable.

A problem to solve is how to use the same design rule for flash-only and flash-plus-logic technology. A possible solution to the problem is to increase contact-to-flash wordline space Y2 for a flash-plus-logic process to accommodate "indirect" alignment registration, while maintaining the contact-to-SRAM wordline space Y1 to accommodate "direct" alignment registration requirement. The increase in contact-to-flash (contact-to-SMS) wordline space Y2 required by flash-plus-logic technology due to indirect alignment may be addressed by one of the following two approaches. Flash-only technology may produce a larger foot print than its capability (specification). Increasing flash cell size may result in an undesirable die size increase.

Alternatively, the increase in contact-to-flash wordline space Y2 may be accomplished by reducing flash wordline width through additional process development, which may result in an undesirable increase in overall process development cycle time and/or complexity.

The spaces X and Y1 may meet the requirement of "direct" alignment nesting tolerance, which may be expressed as:

$$X = Y_1 = n \cdot \sqrt{\left(\frac{\sigma_{CON}}{2}\right)^2 + \left(\frac{\sigma_{PLY}}{2}\right)^2 + \sigma_r^2}$$

where $\sigma_{CON}$ and $\sigma_{PLY}$ are 1-sigma variations of feature size distribution of a contact mask layer and a PLY mask layer, respectively. $\sigma_r$ is 1-sigma variation of registration distribution of an alignment process. n is the number of sigma required for the tolerance distribution.

Contact-to-SMS nesting tolerance, Y2, may be expressed as:

$$Y_2 = n \cdot \sqrt{\left(\frac{\sigma_{CON}}{2}\right)^2 + \left(\frac{\sigma_{SMS}}{2}\right)^2 + 2 \cdot \sigma_r^2}$$

at best due to "indirect" alignment of the contact layer 101 to the SMS polysilicon layer 104. $\sigma_{CON}$ and $\sigma_{SMS}$ are 1-sigma variations of feature size distribution of a contact mask layer 101 and the SMS mask layer 104, respectively.

Figure 2:
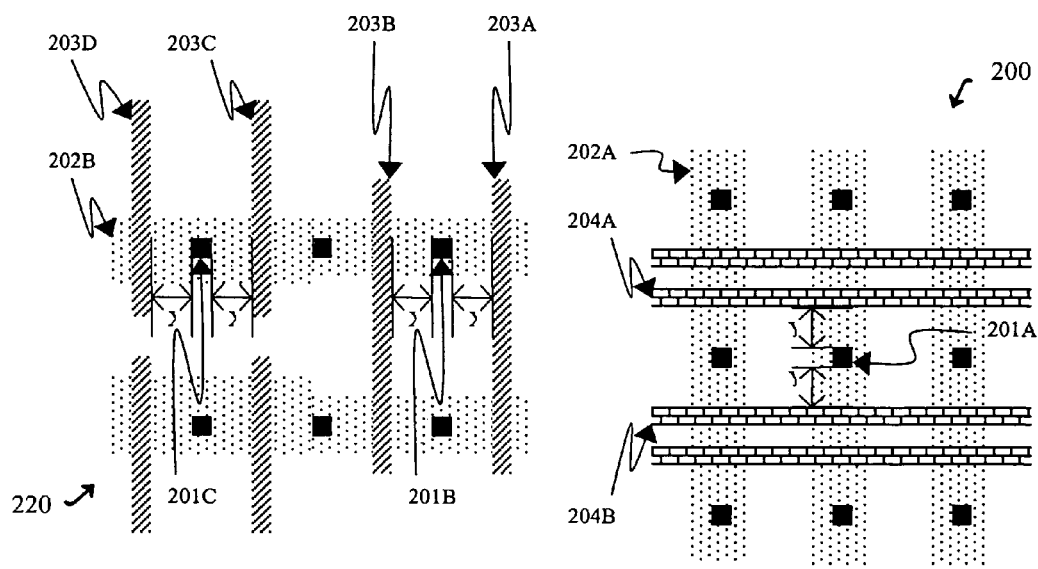
FIG. 2 illustrates a flash plus logic configuration on a shared substrate in accordance with an embodiment of the present application.

FIG. 2 illustrates a flash 200 plus logic 220 configuration on a shared substrate in accordance with an embodiment of the present application. A flash memory cell 200 in FIG. 2 may have a flash bitline contact 201A, a flash diffusion layer 202A in the form of a strip, and "SMS" flash wordlines 204A, 204B. The logic 220 in FIG. 2 may include an SRAM bitline contact 201B, a transistor source/drain (S/D) contact 201C, an SRAM diffusion layer 202B in the form of a strip, "PLY" SRAM wordlines 203A, 203B and PLY transistor gates 203C, 203D. The configuration of FIG. 2 may be used to produce an embedded flash product.

Figure 3:
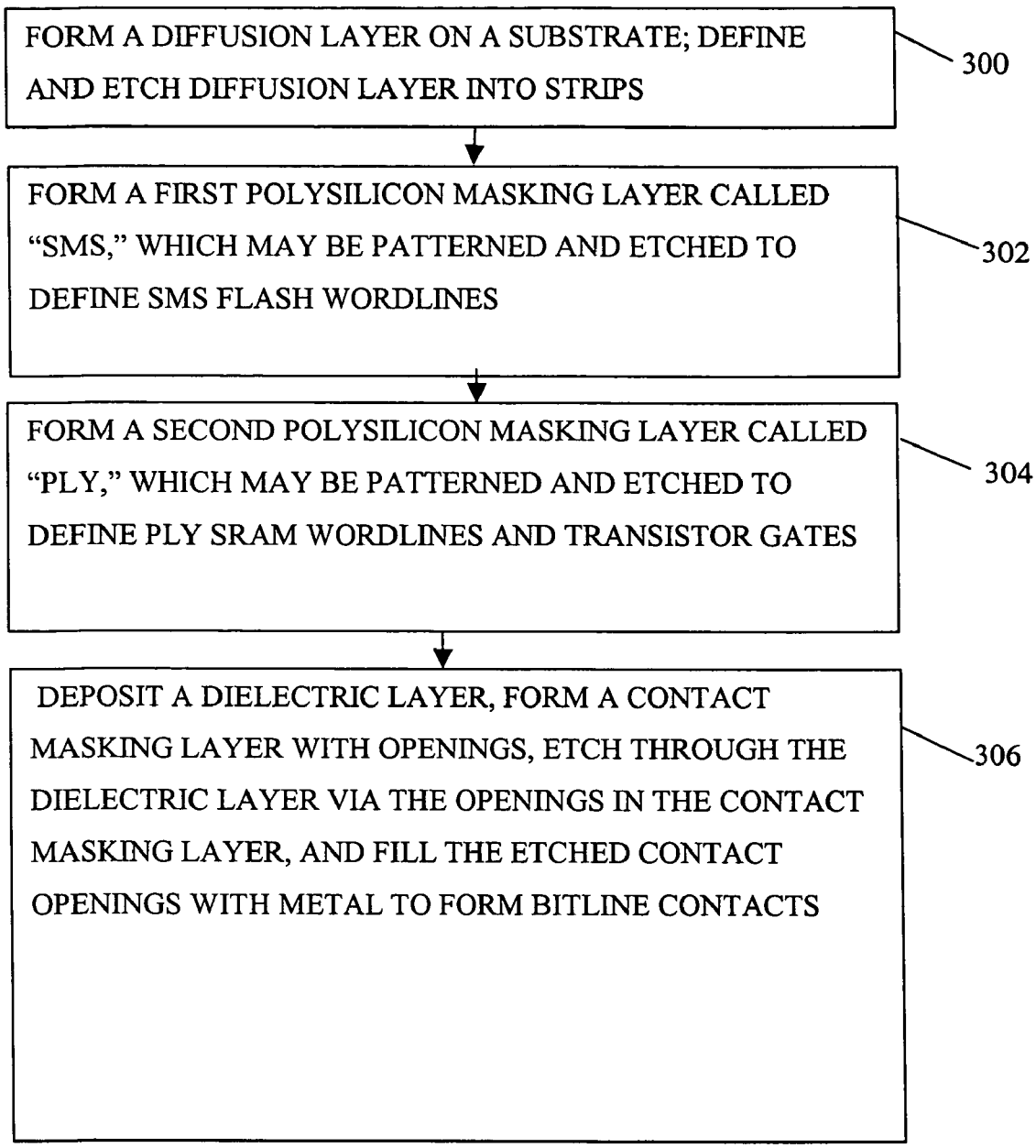
FIG. 3 illustrates an example of a method for forming the flash plus logic configuration in FIG. 2.

FIG. 3 is a flow diagram of a method for forming the flash 200 plus logic 220 configuration in FIG. 2. The method may form a diffusion layer 202 on a substrate at 300. A lithography tool may form a pattern on the diffusion layer 202, which is etched to define the flash diffusion strips 202A and SRAM diffusion strips 202B as shown in FIG. 2. The method may form a first polysilicon masking layer 204 called "SMS," which may be patterned and etched to define SMS flash wordlines 204A, 204B at 302. The method may form a second polysilicon masking layer 203 called "PLY," which may be patterned and etched to define PLY SRAM wordlines 203A, 203B and transistor gates 203C, 203D at 304. The method may then optionally deposit a NESL layer, deposit a dielectric layer, form a contact masking layer 201 with openings, etch through the dielectric layer via the openings in the contact masking layer, and fill the etched contact openings with metal to form the flash bitline contact 201A, SRAM bitline contact 201B and transistor bitline contact 201C at 306. The PLY masking layer 203 is directly aligned to the SMS masking layer 204, and the contact layer 201 is directly aligned to both the SMS and PLY layers 204, 203. In an alternative method, the PLY polysilicon layer 203 may be formed before the SMS polysilicon layer 204.

The improved alignment method of FIG. 3 to form flash memory plus logic may reduce a registration requirement of contacts 201A, 201B, 201C to gates 204A, 204B, 203A-203B, 203C-203D. The new contact alignment method may "directly" align the contact layer 201 (used to form contacts 201A, 201B, 201C) simultaneously to the SMS layer 204 and the PLY layer 203 (used to form flash wordlines 204A-204B, SRAM wordlines 203A-203B, and PLY transistor gates 203C-203D). The method may use orthogonally orientated gates between SRAM and flash cells 220, 200. For example, the method may:

- orient the SMS flash wordlines 204A, 204B, in a first direction, e.g., horizontal or X-direction in FIG. 2;
- orient the PLY SRAM wordlines 203A, 203B and transistor gates 203C, 203D in a second direction perpendicular to the first direction, e.g., vertical or Y-direction; and
- directly align the contact layer to the SMS layer 204 in the Y-direction and directly align the contact layer 201 to the PLY layer 203 in the X-direction. Thus, the SMS flash wordlines 204A-204B may be orthogonally placed with respect to the PLY SRAM wordlines 203A, 203B and PLY transistor gates 203A-203D.

The structure of FIG. 2 and method of FIG. 3 may have several benefits and advantages. SRAM wordlines 203A, 203B and logic gates 203C, 203D are parallel and may be formed in the same masking layer and etch process. Two layers with direct alignment (201 and 203; 201 and 204) may be implemented instead of three layers 101, 104, 103 with indirect alignment, as in FIG. 1.

The method above may allow the same spacing between a flash wordline stack and an SRAM wordline stack, i.e., X=Y in FIG. 2. A wordline "stack" is a layout of repeated wordlines in a constant pitch. The registration requirement of contact-to-PLY (contact layer 201 to PLY layer 203) may be reduced from two dimensions (Y1 and X in FIG. 1) to one dimension (X in FIG. 2).

Due to independent alignment in orthogonal directions of the nesting alignment system, the new contact alignment scheme may simultaneously and directly align the flash bit-line contact 201A to flash wordlines 204A-204B in the Y-direction and directly align the contacts 201B, 201C to the PLY SRAM wordlines and transistor gates 203A-203D in the X-direction. Therefore, nesting tolerance of both X and Y may meet the minimum space of a "direct" alignment scheme. X and Y may be expressed as:

$$X = Y = n \cdot \sqrt{\left(\frac{\sigma_{CON}}{2}\right)^2 + \left(\frac{\sigma_{GATE}}{2}\right)^2 + \sigma_r^2}$$

A device fabricated by the method above may have:

- two distinct layers, such as SMS and PLY in an embedded flash product, which has features orthogonally placed with respect to each other; and
- identical spaces Y, X between the stacked features of each of the two distinct layers 203, 204, which allow the feature placement of a third layer 201, such as a contact layer 201.

The methods described herein may be based on (a) the independent alignment capability and requirement of the nesting tolerance model in orthogonal directions and (b) orthogonally oriented SMS flash wordlines 204A, 204B, and PLY SRAM wordlines 203A, 203B. A contact layer 201 thus aligns to SMS and PLY layers 204, 203 independently without the penalty of indirect alignment tolerance between three layers (FIG. 1).

Reduction of a registration requirement may be close to about 40%, and die size improvement due to stack gate pitch reduction may be about 4%. The methods described herein may also share learning between flash and logic technologies for porting on to flash-plus-logic without incremental yield ramp requirement in contact-to-gate capability. In addition, the methods may take advantage of registration capabilities of a lithography tool for both flash and SRAM cell sizes in an integrated flash-plus-logic process. This may help reduce cell sizes.

A number of embodiments have been described. Nevertheless, it will be understood that various modifications may be made without departing from the spirit and scope of the application. Accordingly, other embodiments are within the scope of the following claims.

What is claimed is:

1. A method comprising:
   forming a first layer on a substrate;
   patterning the first layer to include a wordline of a memory cell;
   forming a second layer on the substrate;
   patterning the second layer to include logic circuitry having a gate; and
   passing a contact via through at least one of the first layer and the second layer and at least into the other of the first layer and second layer, the contact via being positioned adjacent the wordline in the first patterned layer and the gate in the second patterned layer,
   wherein a smallest lateral spacing between the contact via and the adjacent wordline in the first layer is smaller than the nesting tolerance of an indirect alignment scheme, and
   wherein a smallest lateral spacing between the contact via and the adjacent gate in the second layer is smaller than the nesting tolerance of an indirect alignment scheme.

2. The method of claim 1, wherein forming the second layer comprises forming the second layer above the first layer.

3. The method of claim 1, wherein patterning the first layer comprises patterning the first layer to include the wordline of a flash memory cell.

4. The method of claim 1, wherein:
   patterning the first layer comprises patterning the first layer to include a collection of wordlines of one or more memory cells; and
   patterning the second layer comprises patterning the second layer to include logic circuitry having a collection of gates that are perpendicular to the collection of wordlines of the one or more memory cells.

5. The method of claim 1, further comprising:
   forming a third layer; and
   patterning the third layer to include a first strip associated with the memory cell and a second strip associated with the logic cell, wherein the first strip is perpendicular to the second strip.

6. The method of claim 5, wherein:
   forming the third layer comprises forming a diffusion layer;
   the first strip comprises a first diffusion layer strip; and
   the second strip comprises a second diffusion layer strip.

7. A method comprising:
   forming a diffusion layer on a substrate:
   forming a first layer on a substrate;
   patterning the first layer to include a collection of wordlines of one or more memory cells, wherein patterning the first layer comprises forming a first masking layer directly aligned to the diffusion layer and etching the first layer;
   forming a second layer on the substrate;
   patterning the second layer to include logic circuitry having a collection of gates that are perpendicular to the collection of wordlines of the one or more memory cells, wherein patterning the second layer comprises forming a second masking layer directly aligned to the first masking layer and etching the second layer;

forming a dielectric layer on the substrate; and patterning the dielectric layer to include a contact via to provide electrical contact to the substrate, wherein patterning the dielectric layer comprises forming a third masking layer directly aligned to the first masking layer in a first direction and directly aligned to the second masking layer in a second direction, and using openings in the third masking layer to form a plurality of bitline contacts.

8. The method of claim 7, wherein the one or more memory cells and the logic circuitry have nesting tolerances of $$X = Y = n \cdot \sqrt{\left(\frac{\sigma_{CON}}{2}\right)^2 \left(\frac{\sigma_{GATE}}{2}\right)^2 + \sigma_r^2},$$

wherein $\sigma_{CON}$ and $\sigma_{GATE}$ are 1-sigma variations of feature size distribution of the first layer and the second layer, respectively, $\sigma_r$ is 1-sigma variation of a registration distribution of an alignment process, and n is a number of sigma required for a tolerance distribution.

9. The method of claim 7, wherein etching the first masking layer forms a wordline comprising a row of flash memory cell control gates.

10. The method of claim 7, wherein etching the second masking layer forms a set of static random access memory wordlines and transistor gates.

11. The method of claim 7, wherein etching the third masking layer defines locations for a flash memory bitline contact, a logic bitline contact, and a transistor contact.

12. The method of claim 7, wherein etching the second layer forms wordlines orthogonal to the collection of wordlines included in the first layer.

13. The method of claim 7, further comprising forming a first bitline contact and a second bitline contact through openings in the third masking layer, the first bitline contact having a first contact-to-gate space in the first direction, the second bitline contact having a second contact-to-gate space in the second direction, the first and second contact-to-gate space being substantially equal.

14. The method of claim 7, further comprising forming first bitline contact and a second bitline contact through openings in the third masking layer, the first bitline contact being directly aligned to the first set of wordlines, the second bitline contact being directly aligned to the second set of wordlines.

15. The method of claim 7, wherein forming the first masking layer uses polysilicon.

16. The method of claim 7, wherein forming the second masking layer uses polysilicon.

17. The method of claim 7, wherein forming the third masking layer follows forming a Nitride Etch Stop Layer.

18. The method of claim 7, wherein forming the third masking layer follows the forming of the dielectric layer.

19. The method of claim 7, further comprising etching the diffusion layer to form a first set of strips associated with flash memory and a second set of strips associated with logic, the first set being perpendicular to the second set.

* * * * *